(12) United States Patent
Shah

(10) Patent No.: US 6,734,462 B1
(45) Date of Patent: May 11, 2004

(54) SILICON CARBIDE POWER DEVICES HAVING INCREASED VOLTAGE BLOCKING CAPABILITIES

(75) Inventor: Pankaj B. Shah, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/313,030

(22) Filed: Dec. 6, 2002

Related U.S. Application Data
(60) Provisional application No. 60/336,721, filed on Dec. 7, 2001.

(51) Int. Cl.[7] .......................................... H01L 31/0312
(52) U.S. Cl. ......................... 257/77; 257/107; 257/656; 257/918; 438/105; 438/133; 438/931
(58) Field of Search ........................... 257/77, 107–182, 257/656, 918; 438/105, 931

(56) References Cited

U.S. PATENT DOCUMENTS

| | | | |
|---|---|---|---|
| 5,491,351 A | | 2/1996 | Bauer et al. |
| 5,539,217 A | * | 7/1996 | Edmond et al. ............... 257/77 |
| 5,569,937 A | | 10/1996 | Bhatnagar et al. |
| 5,703,383 A | | 12/1997 | Nakayama |
| 5,814,546 A | | 9/1998 | Hermansson |
| 5,831,289 A | | 11/1998 | Agarwal |
| 5,831,292 A | | 11/1998 | Harris et al. |
| 5,914,500 A | | 6/1999 | Bakowski et al. |
| 5,932,894 A | | 8/1999 | Bakowski et al. |
| 6,002,143 A | | 12/1999 | Terasawa |
| 6,011,279 A | | 1/2000 | Singh et al. |
| 6,236,069 B1 | | 5/2001 | Shinohe et al. |
| 6,501,099 B2 | * | 12/2002 | Shah ........................... 257/77 |

OTHER PUBLICATIONS

Shah Silicon Carbide Distributed Buffer Gate Turn–off Thyristor Structure for Blocking High Voltages, Electronic Letters, 2000, 36(25), 2108–2109.

Ryu, et al., 3100 V, Asymmetrical, Gate Turn–off (GTO) Thyristors in 4H–SiC, IEEE Electron Device Letters, 2001, 22(3), 127–129.

Agarwal, et al., 700–V Asymmetrical 4H–SiC Gate Turn–off Thyristors (GTO's), IEEE Electron Device Letters, 1997, 18(11), 518–520.

Li, et al., High Current Density 800–V 4H–SiC Gate Turn–off Thyristors, IEEE Electron Device Letters, 1999, 20(5), 219–222.

Cao, et al., Characterization of 4H–SiC Gate Turn–off Thyristor, Solid–State Electronics, 2000, 44, 347–352.

Shah, et al., Advanced Operational Techniques and pn–pn–pn Structures for High–Power Silicon Carbide Gate Turn–off Thyristors, Sensors and Electron Devices Directorate, U.S. Army Research Laboratory, AMSRL–SE–RL, Adelphi, MD, 1232–1236.

(List continued on next page.)

*Primary Examiner*—David Nelms
*Assistant Examiner*—Andy Huynh
(74) *Attorney, Agent, or Firm*—William V. Adams

(57) ABSTRACT

A structure and method for a voltage blocking device comprises a cathode region, a drift region positioned on the cathode region, a gate region positioned on the drift region, an anode region positioned on the gate region and a plurality of contacts positioned on each of the cathode region, the gate region, and the anode region, wherein the drift region comprises multiple epilayers having first doped type layers surrounding second doped type layers, wherein dopant concentrations of the first doped type layers are lower than dopant concentrations of the second doped type layers. The epilayers comprise at least one i-n-i layer and/or at least one i-p-i layer. Moreover, the multiple epilayers are operable to block voltages in the device.

20 Claims, 14 Drawing Sheets

OTHER PUBLICATIONS

Dutta, et al., Design Considerations for p–i–n Thyristor Structures, IEEE Transactions On Power Electronics, 1992, 7(2), 430–435.

Alok, et al., SiC Devices Edge Termination Using Finite Area Argon Implantation, IEEE Transactions On Electron Devices, 1997, 44(6), 1013–1017.

Agarwal, et al., 2600 V, 12 A, 4H–SiC, Asymmetrical Gate Turn Off (GTO) Thyristor Development, ICSCRM99 Proceedings, 1999.

Agarwal, et al., Turn–off performance of 2.6 kV 4H–SiC asymmetrical GTO thyristor, Semiconductor Science and Technology, 2001, 18, 260–262.

Shah, et al., In–depth analysis of SiC GTO thyristor performance using numerical simulations, Solid–State Electronics, 2000, 44, 353–358.

Shah, 4H–silicon carbide modified–anode gate turn–off thyristor, Electronics Letters, 2000, 36(7), 671–672.

Xie, et al., A High–Current and High–Temperature 6H–SiC Thyristor, IEEE Electron Device Letters, 1996, 17(3), 142–144.

\* cited by examiner

SILICON CARBIDE POWER DEVICES HAVING INCREASED VOLTAGE BLOCKING CAPABILITIES

CROSS-REFERENCE TO RELATED APPLICATION

This application claims the benefit of U.S. Provisional Patent Application No. 60/336,721 filed Dec. 7, 2001.

BACKGROUND OF THE INVENTION

1. Field of the Invention

The present invention generally relates to semiconductor electronic switches, and more particularly to high power, high temperature gate-assisted turn-off thyristor devices, that use a multi-layered thick drift region to increase the voltage blocked.

GOVERNMENT INTEREST

The invention described herein may be manufactured, used and/or licensed by or for the United States Government.

2. Description of the Related Art

Thyristors are bistable power semiconductor devices that can be switched from an off-stale to an on-state, or vice versa. Thyristors, along with other power semiconductor devices such as high-power bipolar junction transistors and power metal oxide semiconductor field effect transistors control or pass large amounts of current and block high voltages. Unlike conventional thyristors, a gate turn-off (GTO) thyristor is turned off by a reverse gate pulse. Generally, a trigger input implements conduction in GTO thyristors. Thereafter, the GTO thyristors behave as diodes.

A thyristor is a very rugged device in terms of transient currents, di/dt, and dv/di capability. The forward voltage ($V_f$) drop in conventional silicon thyristors is approximately 1.5 V to 2 V, and for some higher power devices, it is approximately 3 V. Therefore, a thyristor can control or pass large amounts of current and effectively block high voltages (i.e., a voltage switch). Although $V_f$ determines the on-state power loss of the device at any given current, the switching power loss becomes a dominating factor affecting the device junction temperature at high operating frequencies. Because of this, the maximum switching frequencies attainable using conventional thyristors are limited, as compared with many other types of power devices.

Two important parameters for a thyristor are the built-in potential (which is a characteristic of any semiconductor material's bandgap) and the specific on-resistance (which is the resistance of the device in the linear region when the device is turned on). Preferably, the specific on-resistance for a thyristor should be as small as possible so as to maximize the current per unit area for a given voltage applied to the thyristor. In particular, the lower the specific on-resistance, the lower the $V_f$ drop is for a given current rating. Moreover, the minimum $V_f$ for a given semiconductor material is its built-in potential (voltage).

Conventional thyristors may be made of silicon, for example, such as a silicon-controlled rectifier. However, thyristors made of silicon have certain performance limitations inherent in the silicon material itself, such as the thickness of the drift region. The largest contributory factor to specific on-resistance is the resistance of the thick low-doped drift region of the thyristor. Typically, as the rated voltage of a thyristor increases, the thickness of the drift region increases and the doping of the drift region decreases. Thus, the resistance of the drift region increases dramatically. Therefore, the thickness of the drift region should be minimized and the level of doping should be maximized, for any given rated voltage so as to minimize the specific on-resistance for the device.

Several thyristor structures have been developed in an attempt to solve the on-resistance problems described above. These conventional devices include variations of the silicon material to try to lower the on-resistance. However, the conventional devices are limited by the inherent characteristics of the silicon semiconductor material itself. The electrostatic breakdown field is lower in silicon than it is in silicon carbide. This, in turn, requires that these portions be physically thicker, which makes for a generally disadvantageous specific resistance.

Silicon carbide offers a number of advantageously unique physical and electronic properties, which makes it particularly useful for thyristors. This includes its high melting point, high thermal conductivity, radiation hardness (particularly to neutron radiation), wide bandgap, high breakdown electric field, and high saturated electron drift velocity. With the high breakdown field, thinner devices can be developed that block a given amount of voltage compared to silicon devices. This provides faster switching devices because a smaller volume of charge carrier must be removed during turn-off. Therefore, the power handling capability of silicon carbide GTO thyristors is much better than that of silicon GTO thyristors. Additionally, silicon carbide is physically rugged and chemically inert.

Because of the superior physical and chemical properties of silicon carbide, several applications for silicon carbide GTO thyristors exist including high voltage DC systems, traction circuits, motor control, power factor control, and other power conditioning circuits. Moreover, these systems may be found in electric or hybrid electric vehicles, including tanks and helicopters. However, one major limitation to the use of conventional silicon carbide GTO thyristors in these systems is the low turn-off gain. Turn-off gain is the ratio of the cathode current being switched off by the GTO thyristor divided by the maximum gate current required for the switching process. If the turn-off gain is low, then the switching losses will be high, thereby reducing the amount of power that a single silicon carbide GTO thyristor can handle. Also, the circuit providing the gate drive current to turn off the GTO thyristor requires extremely robust devices, which increases the cost and complexity of the overall system.

Conventional approaches have attempted to provide a device capable of blocking substantially high voltages. In particular, silicon carbide GTO thyristors have been used to try to achieve these results. Unfortunately, the conventional devices have not achieved the level of satisfaction sought. In order to prevent the breakdown of the voltage blocking capability, techniques are required to reduce the maximum electric field that occurs in the high voltage device at a given voltage. Conventional approaches for silicon GTO thyristors include field rings, field plates, beveling, and ion implanted edge terminations, which have been tested in silicon carbide GTO thyristors. However, the performance and yield in large batches of these conventional devices remain unacceptable. While silicon carbide GTO thyristors that block up to 3.3 kV have been implemented, these devices use a 50 micron thick drift region to support this high voltage, wherein such a thickness would indicate that these devices should actually block over 6.5 kV. Thus, the conventional devices are underachieving. Also, this maximum value of 3.3 kV has shown to be inconsistently achievable.

Furthermore, the thick material is difficult to grow, leading to rough surfaces and poor electrical characteristics such as low free carrier lifetimes and mobility (electron and hole mobilities).

Conventional methods and devices for increasing the amount of voltage that can be blocked in a bipolar device use a shallow etch and a field stop on a pin structure. Unfortunately, this brings the maximum value of the electrostatic field near the surface of mesa isolated devices. This causes disadvantageous effects because physical corners, such as those between the mesa and the flat silicon carbide regions outside of the mesa, create mesa isolation, and further concentrate the electrostatic field, thereby increasing the carrier generation due to impact ionization. This leads to a lower blocking voltage. Moreover, the conventional devices use oxides deposited on the surface of the devices, wherein these surfaces are very close to this high electrostatic field region, leading to additional breakdown. Furthermore, because the mesa region is narrower than the substrate, the current density is very high near the location of high electrostatic field, leading to enhanced impact ionization.

Therefore, there remains a need for further development of silicon carbide GTO thyristors capable of blocking increased high voltages, which also overcome the deficiencies of the conventional devices.

SUMMARY OF THE INVENTION

In view of the foregoing, an embodiment of the invention provides a device that is capable of blocking increased voltages by using a multi-layered thick drift region. Moreover, an embodiment of the invention provides a silicon carbide GTO thyristor having improved voltage blocking characteristics. Specifically, an embodiment of the invention provides a silicon carbide GTO thyristor in which the drift region contains multiple layers of different dopant concentrations to reshape the electrostatic field, wherein the highest magnitude of the electrostatic field is located in a predetermined location within the thyristor which produces better voltage blocking results. Additionally, an embodiment of the invention provides a silicon carbide GTO thyristor in which the maximum electrostatic field in the thyristor occurs at a much higher applied voltage.

An embodiment of the invention provides a structure for a voltage blocking device comprising a cathode region, a drift region positioned on the cathode region, a gate region positioned on the drift region, an anode region positioned on the gate region and a plurality of contacts positioned on each of the cathode region, the gate region, and the anode region, wherein the drift region comprises multiple epilayers having first doped type layers surrounding second doped type layers, wherein dopant concentrations of the first doped type layers are lower than dopant concentrations of the second doped type layers. The epilayers comprise at least one i-n-i layer and/or at least one i-p-i layer. Moreover, the device comprises silicon carbide. Furthermore, the device is a gate turn-off (GTO) thyristor, or the device comprises any one of an insular gate bipolar transistor, a silicon controlled rectifier, a pin diode, a gate turn-off device, and a metal oxide semiconductor turn-off device. Additionally, the multiple epilayers are operable to block voltages in the device.

Alternatively, an embodiment of the invention provides a structure for a silicon carbide thyristor device comprising a cathode region, a drift region positioned on the cathode region, a gate region positioned on the drift region, an anode region positioned on the gate region, and a plurality of ohmic contacts positioned on each of the cathode region, the gate region, and the anode region, wherein the drift region comprises multiple doped layers comprising n-type and p-type dopants and having first doped type layers surrounding second doped type layers, wherein dopant concentrations of the first doped type layers are lower than dopant concentrations of the second doped type layers, and wherein the multiple doped layers are operable to block voltages in the device. The multiple doped layers comprise at least one i-n-i layer and/or at least one i-p-i layer. Furthermore, the device is a gate turn-off (GTO) thyristor, or any one of an insular gate bipolar transistor, a silicon controlled rectifier, a pin diode, a gate turn-off device, and a metal oxide semiconductor turn-off device.

Additionally, an embodiment of the invention provides a method of increasing a voltage threshold in a voltage blocking device comprising a cathode region adjacent a drift region, the drift region adjacent a gate region, and the gate region adjacent an anode region, wherein the method comprises adding additional epilayers to the drift region, wherein each one of the epilayers comprises a predetermined dopant concentration. The epilayers comprise at least one i-n-i layer and/or at least one i-p-i layer. The step of adding additional epilayers to the drift region causes an electrostatic field located in the device to move away from an upper portion of the drift region. Moreover, the multiple epilayers block voltages in the device.

The embodiments of the invention achieve several advantages. For example, the invention reduces the number of processing steps involved in forming a high voltage blocking device because the lithography and deposition steps needed for field rings and field plates, or the lithography, implant and annealing processing steps required of guard rings or junction termination extensions can be avoided. An embodiment of the invention also makes it possible to develop high voltage blocking devices by using a thinner overall drift region which has the added benefit of lower cost and better material quality. In fact, because the material quality worsens as an epilayer becomes thicker, which is a problem inherent in the conventional devices, an embodiment of the invention overcomes this deficiency by providing thinner multiple layers.

BRIEF DESCRIPTION OF THE DRAWINGS

The invention will be better understood from the following detailed description of a preferred embodiment(s) of the invention with reference to the drawings, in which.

DETAILED DESCRIPTION OF PREFERRED EMBODIMENTS OF THE INVENTION

Figure 1:
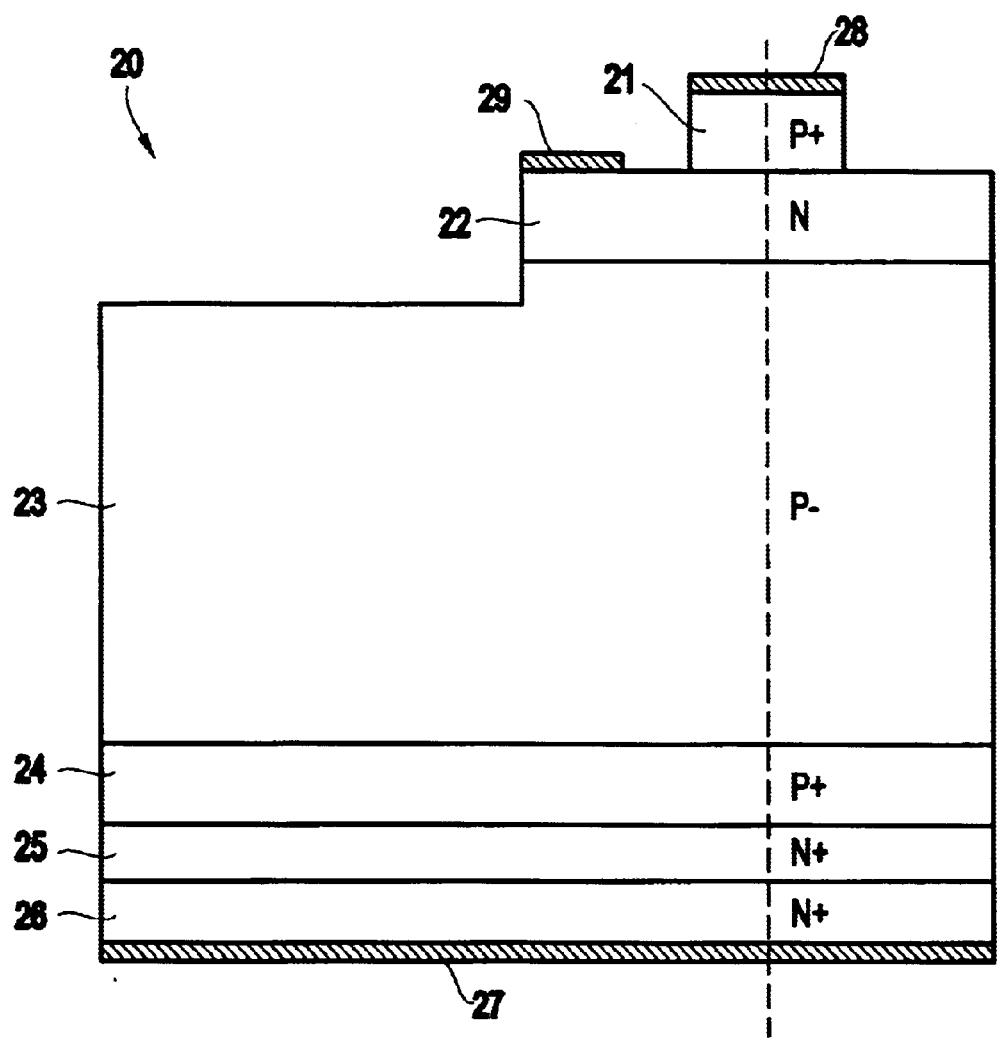
FIG. 1 is a schematic diagram of a conventional silicon carbide GTO thyristor.

As previously mentioned, there is a need for further development of silicon carbide GTO thyristors capable of blocking increased high voltages, and which overcome the deficiencies of the conventional devices. Referring now to the drawings, and more particular to FIGS. 2 through 14, there are shown preferred embodiments of the present invention. Generally, an embodiment of the invention provides a device, such as an asymmetric silicon carbide GTO thyristor, that uses a multi-layered drift region to increase the voltage blocked, wherein the device is modified such that the drift region contains multiple layers of different dopant concentrations so that the electrostatic field is reshaped. Thus, the maximum electrostatic field is located in a more advantageous (less harmful) location within the device. The devices of the embodiments of the invention, including silicon carbide GTO thyristors, are capable of handling higher voltages, operate over a wider temperature range, and achieve a high turn-off gain as compared to conventional devices. Because of the electronic and physical characteristics of silicon carbide, the thyristor of the invention is made of silicon carbide and provides improved on-resistance and high temperature performance over conventional thyristors made of silicon.

The various embodiments of the invention provide structures that increase the amount of voltage that can be blocked in all bipolar devices that use a pin structure to block high voltages. Included in these devices are insular gate bipolar transistors (IGBT), silicon controlled rectifiers (SCR), pin diodes, gate turn-off devices, metal oxide semiconductor (MOS) turn-off devices, and any other device that uses a thick drift region to increase the voltage blocked.

For purposes of illustration, the examples herein relate to silicon carbide GTO thyristors. However, those skilled in the art would readily appreciate that any device that uses a thick drift region to increase the voltage blocked can be modified to provide multiple layers of different dopant concentrations to reshape the electrostatic field. Moreover, any material system, including silicon, gallium arsenide, among others, in which both p and n type materials can be formed, will benefit from this reshaping of the electrostatic field.

Embodiments of the present invention differ by the type of intrinsic layer around the new buffer region. For purposes of the present application, "high doped layer" will be used interchangeably with "new buffer region". The basic idea is that additional higher doped layers are introduced into the drift region to increase the voltage blocked. Each high doped layer is surrounded by low doped intrinsic or "i" regions, and these regions can be either p type or n type.

There is no theoretical limit to the number of high doped layers introduce. In practice, this may be limited by the capability of the equipment used to grow the material or the skill of the person running the material growth equipment. For each high doped layer introduced into the drift region, it is surrounded with either: (1) both low doped p type material (p-); or (2) both low doped n type material (n-); or (3) one p- and one n-material.

In the third situation where there is one p- and one n-material, there is an additional degree of freedom in that the p- layer may be on top of the high doped layer, and the n-layer on the bottom. Alternatively, the n-layer may be on top of the high doped layer and the p-layer on the bottom.

Figure 2:
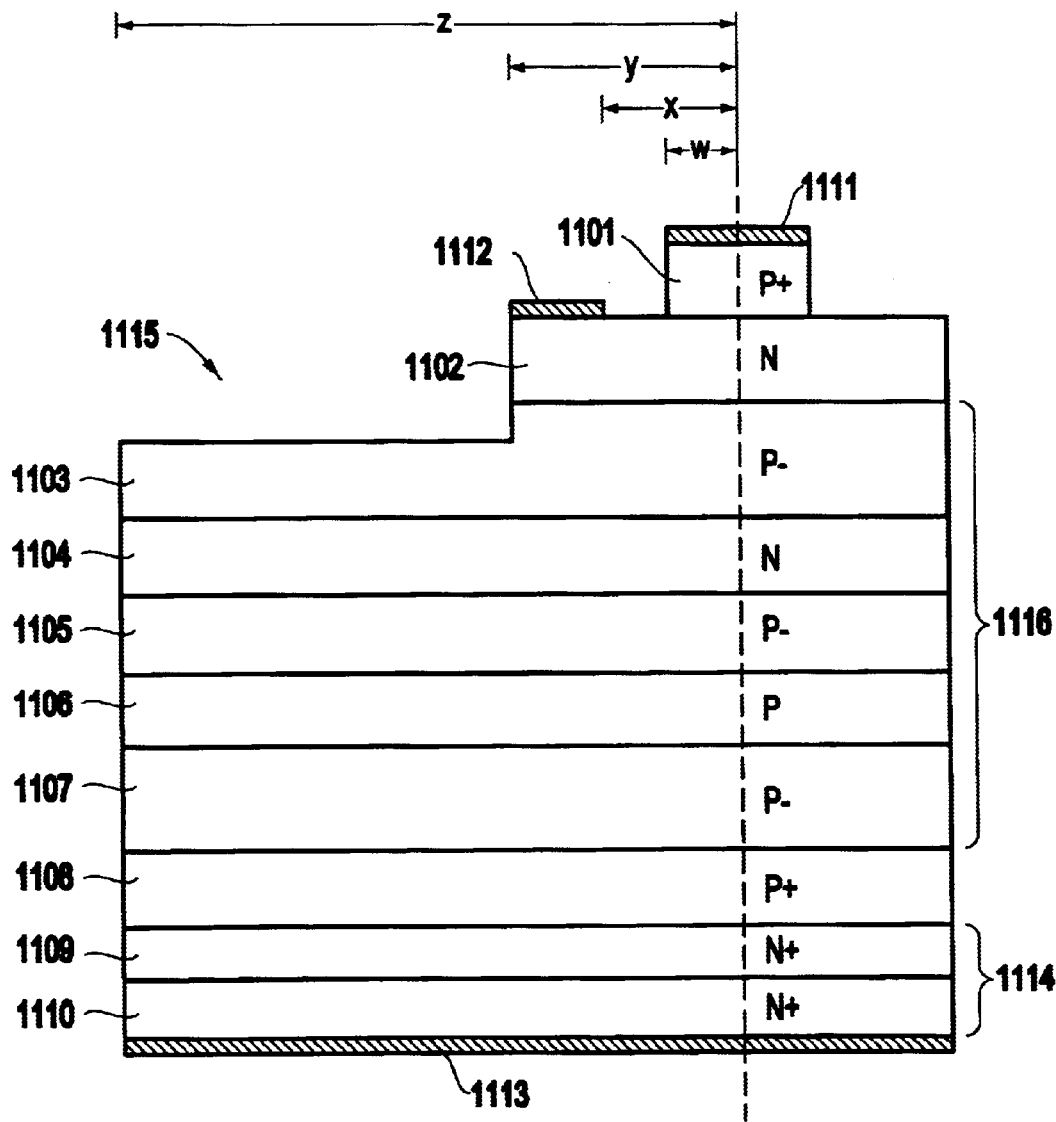
FIG. 2 is a schematic diagram of a silicon carbide GTO thyristor according to a first embodiment of the invention.

FIGS. 1 and 2 show structures which represent one finger of a multi-finger silicon carbide GTO thyristor structure that can be formed by repeating this structure laterally (from left to right). The n and p designations labeling the regions in FIGS. 1 and 2 refer to the majority charge carriers present in those regions. For example, in an n-type region, "electrons" are the majority carriers, and in a p-type region, "holes", or the absence of electrons, are the majority carriers. To make a region n-type, additional nitrogen or phosphorus atom impurities (donors, $N_D$) are typically added to the silicon carbide crystal. To make a region p-type, aluminum or boron impurities (acceptors, $N_A$) are typically added to the silicon carbide crystal.

FIG. 1 represents a conventional prior art device, which is illustrated as a means of comparing it with the embodiments of the present invention. The silicon carbide regions, shown as elements 21, 22, 23, 24, 25, and 26, from the top to bottom of FIG. 1 form a p-n-p-p-n structure. Specifically, the prior art GTO thyristor device 20 comprises an anode region 21 overlying a gate region 22 overlying a drift region 23 overlying a plurality of buffer layers 24, 25, which overlie a substrate 26. Buffer layer 25 together with the substrate 26 form the cathode of the device 20. Furthermore, the device 20 comprises a plurality of metal contacts including an anode contact 28, a gate contact 29, and a cathode contact 27.

A first embodiment of the invention is illustrated in FIG. 2, which provides a silicon carbide distributed buffer GTO thyristor 1115 comprising an anode 1101, a gate 1102 adjacent to the anode 1101, a multi-layered drift region 1116 (collectively comprising doped layers 1103, 1104, 1105, 1106, 1107) adjacent to the gate 1102, a high doped P+ buffer layer 1108 adjacent to the drift region 1116, a N+ layer 1109 adjacent to the P+ buffer layer 1108, and a substrate 1110 adjacent to the N+ layer 1109, wherein region 1109 and substrate 1110 collectively form the cathode region 1114 of the device 1115. The substrate 1110, the anode 1101, the drift region 1116, the gate 1102, and the cathode 1114 are each preferably formed of silicon carbide having a polytype comprising any of 3C, 2H, 4H, 6H, and 15R. The regions labeled p- or n- in FIG. 2 are the lowest doped semiconductor regions (the intrinsic or "i" regions). As an example, the device 1115 may be dimensioned to be 3.0 µm as indicated by dimension w, 5.0 µm as indicated by dimension x, 7.0 µm as indicated by dimension y, and 40.0 µm as indicated by dimension z. As illustrated in FIG. 2, an embodiment of the invention provides a method for increasing the voltage blocked by the thyristor 1115 by introducing additional doped layers 1103, 1104, 1105, 1106, 1107 in the drift region 1116. Each high doped layer 1104, 1106 is surrounded by low doped intrinsic regions 1103, 1105, 1107 (p- in this embodiment), but it could be either p type or n type.

Furthermore, ohmic contacts 1111, 1112, 1113 preferably comprising aluminum, aluminum-titanium alloy, platinum, platinum silicide, or nickel, are formed on the anode 1101, gate 1102, and cathode 1114 to provide respective anode contacts 1101, gate electrode contacts 1112, and cathode contacts 1131.

Table 1 shows the material parameters used in simulating the conventional device shown in FIG. 1. Conversely, Table 2 describes each layer and shows the material parameters of the device 1115 shown in FIG. 2.

TABLE 1

Material parameters used in simulating conventional device

| Region | Type | Thickness (μM) | Dopant Concentration (cm$^{-3}$) |
|---|---|---|---|
| 21 | P | 0.5 | $N_A = 2.5 \times 10^{19}$ |
| 22 | N | 1.25 | $N_D = 2.5 \times 10^{17}$ |
| 23 | P | 15.0 | $N_A = 1 \times 10^{15}$ |
| 24 | P | 2.0 | $N_A = 5 \times 10^{18}$ |
| 25 | N | 0.5 | $N_D = 1 \times 11^{18}$ |
| 26 | N | substrate | $N_D = 2 \times 10^{18}$ |

TABLE 2

Material parameters used in an embodiment of the invention

| Region | Type | Thickness (μM) | Dopant Concentration (cm$^{-3}$) |
|---|---|---|---|
| 1101 | P | 0.5 | $N_A = 2.5 \times 10^{19}$ |
| 1102 | N | 1.25 | $N_D = 2 \times 10^{17}$ |
| 1103 | P | 3 | $N_A = 1 \times 10^{15}$ |
| 1104 | N | 3 | $N_D = 1 \times 10^{16}$ |
| 1105 | P | 3 | $N_A = 1 \times 10^{15}$ |
| 1106 | P | 3 | $N_A = 1 \times 10^{16}$ |
| 1107 | P | 3 | $N_A = 1 \times 10^{15}$ |
| 1108 | P | 2.0 | $N_A = 5 \times 10^{18}$ |
| 1109 | N | 0.5 | $N_D = 1 \times 10^{18}$ |
| 1110 | N | substrate | $N_D = 2 \times 10^{18}$ |

The location, concentration, and thickness of the n-type buffer can be optimized for the structure 1115 shown in FIG. 2. Moving the n-type buffer down 1 micron, by increasing the thickness of region 1104 to 3 microns and reducing the thickness of region 6 to 9.5 microns reduces the breakdown voltage, $V_{BR}$ to 2098 V. However, increasing the dopant concentration of the n-type buffer to $8 \times 10^{16}$ cm$^{-3}$ reduces the $V_{BR}$ to 2040 V. This occurs because the electrostatic field in regions 1103 and 1104 decreases. A similar field profile is obtained with thicker n-type buffer (2.5 microns) and thinner drift region 1104 (9.5 microns), reducing the $V_{BR}$ to 1958 V. Increasing the concentration of region 1105 to $8 \times 10^{16}$ cm$^{-3}$ and reducing its thickness to 1 micron, increases the $V_{BR}$ to 2340 V. The manner in which an increased voltage threshold is achieved in the device 1115 is by choosing appropriate thicknesses, concentrations, and number of layers to add to the drift region 1116 within the device 1115. These measurements indicate that there is a tradeoff between the ease of processing the device vs. the performance of the device.

Preferably, the high doped buffer layers should be doped higher than the drift region (between about $1 \times 10^{16}$ and $1 \times 10^{18}$ cm$^{-3}$). These high doped regions preferably range in thickness from about 0.5 micron to about 6 microns, but should be no more than about 30 percent of the drift region. The high doped layers are preferably doped between about $1 \times 10^{15}$ and $1 \times 10^{18}$ cm$^{-3}$ if the dopants are different from those used in the drift regions, i.e., if their dopants have smaller ionization energies from those used in the drift regions. Lower dopant concentration is allowed because smaller ionization energy also leads to a higher space charge.

Figure 3:
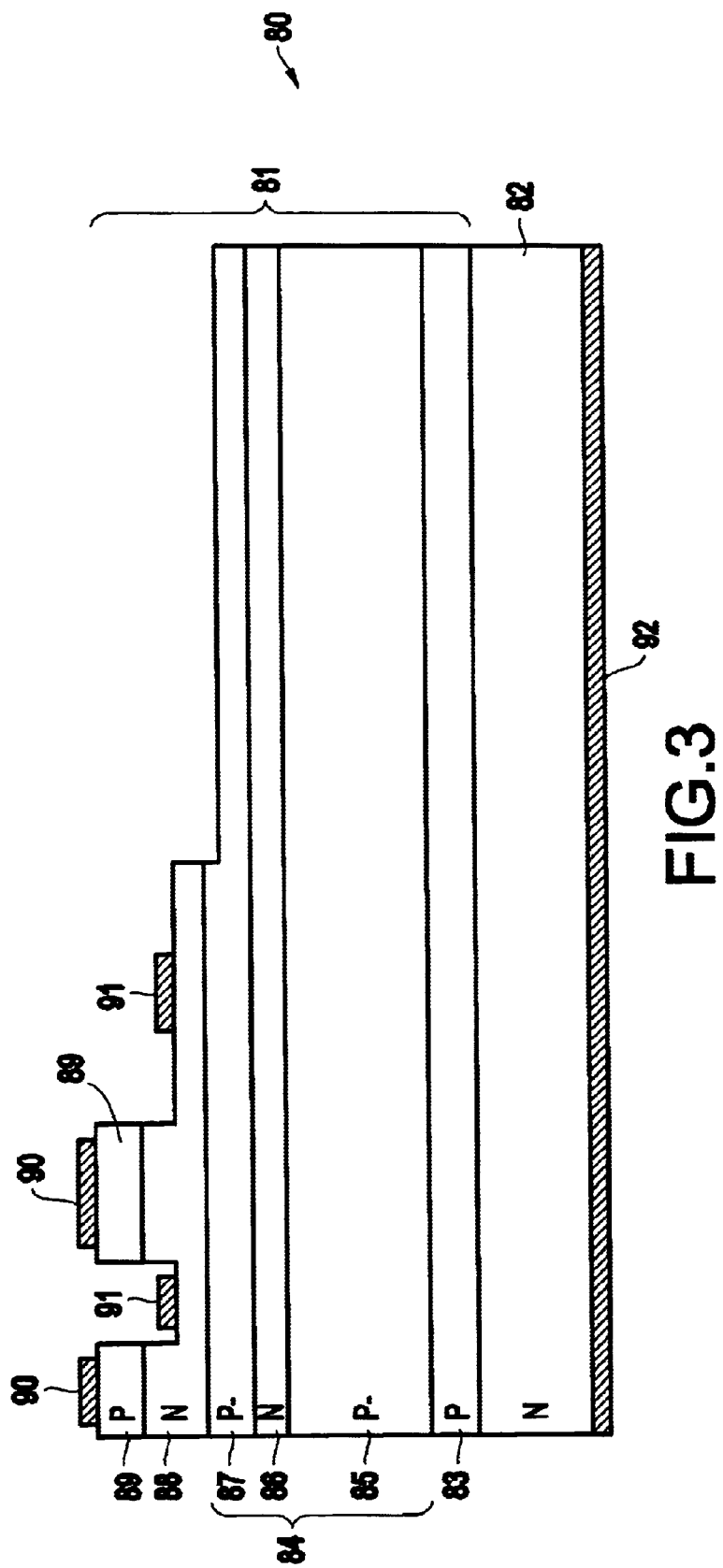
FIG. 3 is a schematic diagram of a silicon carbide GTO thyristor according to a second embodiment of the invention.

Other embodiments illustrated in FIGS. 3 through 6, and described further below, differ by the type of intrinsic "i" layer around a new buffer region. FIG. 3 illustrates a thyristor 80 according to a second embodiment of the invention, which comprises a plurality of epilayers 81 and a substrate 82. The substrate 82 is the cathode region 82, located above a cathode contact 92. The lowest epilayer is a p type buffer region 83. Above the buffer region 83 is the drift region 84, including p-layer 85, n layer 86 (new buffer region) and p-region 87. This is topped by a gated base region 88 and an anode region 89. Gate contacts 91 and anode contacts 90 are located on the gated base region 88 and anode region 89, respectively. The regions labeled p- in FIG. 3 are the lowest doped semiconductor regions (the intrinsic or "i" regions).

Figure 4:
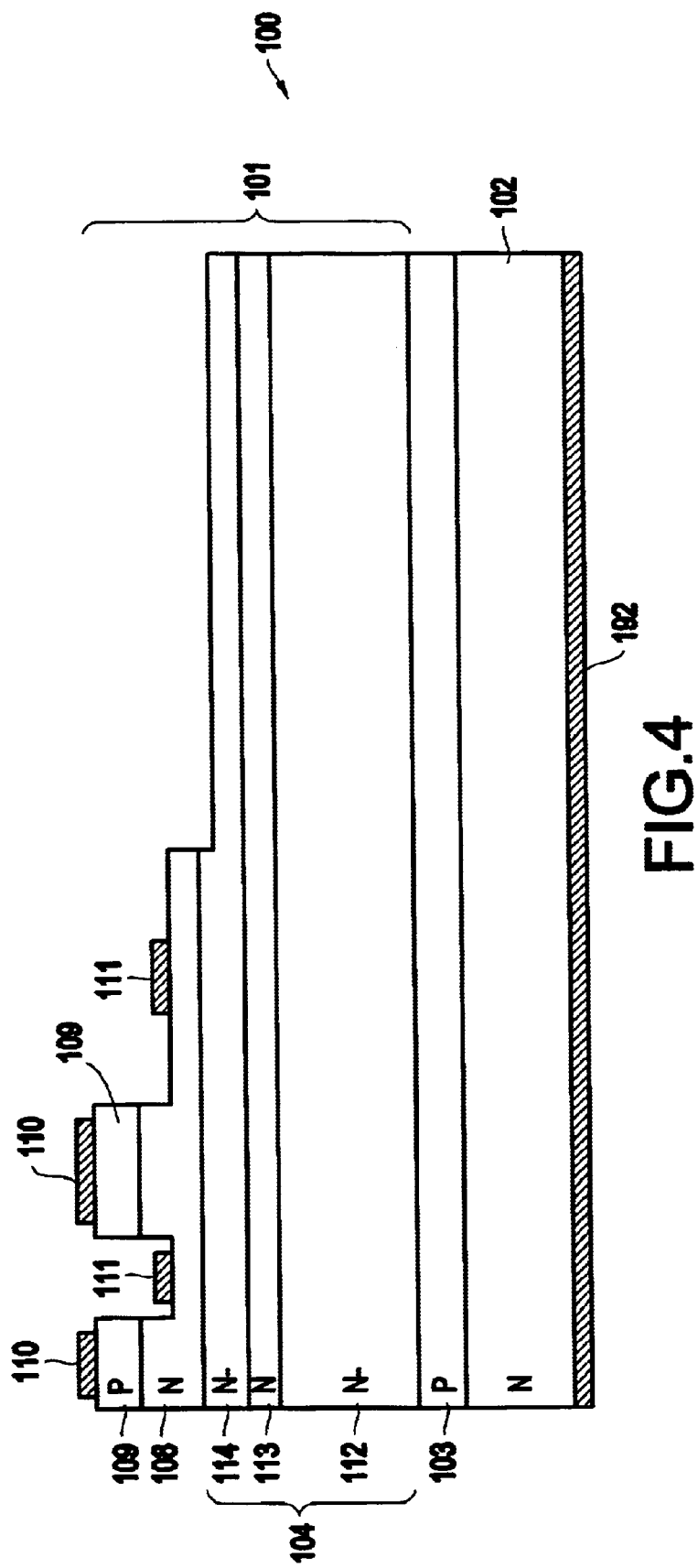
FIG. 4 is a schematic diagram of a silicon carbide GTO thyristor according to a third embodiment of the invention.

Another GTO silicon carbide thyristor 100 according to a third embodiment of the invention is shown in FIG. 4. Here, the bottom layer 192 of the device 100 is the cathode contact 192. Above the cathode contact 192 is the cathode regions 102, which is also the substrate 102. A buffer region 103 separates the substrate 102 from the epilayers 101. The drift region 104 includes three n-type regions, 112, 113, and 114 where region 113 is doped higher than region 112 or 114. The top n-type region 114 is dimensioned and configured to be thick enough so that the etch processing steps employed to reach this surface do not break through the region 114. Also, a gated base region 108 and an anode region 109 are positioned above the drift region 104. Moreover, gate contacts 111 and anode contacts 110 are positioned above the gated base region 108 and anode region 109, respectively. The regions labeled n- in FIG. 4 are the lowest doped semiconductor regions (the intrinsic or "i" regions).

Figure 5:
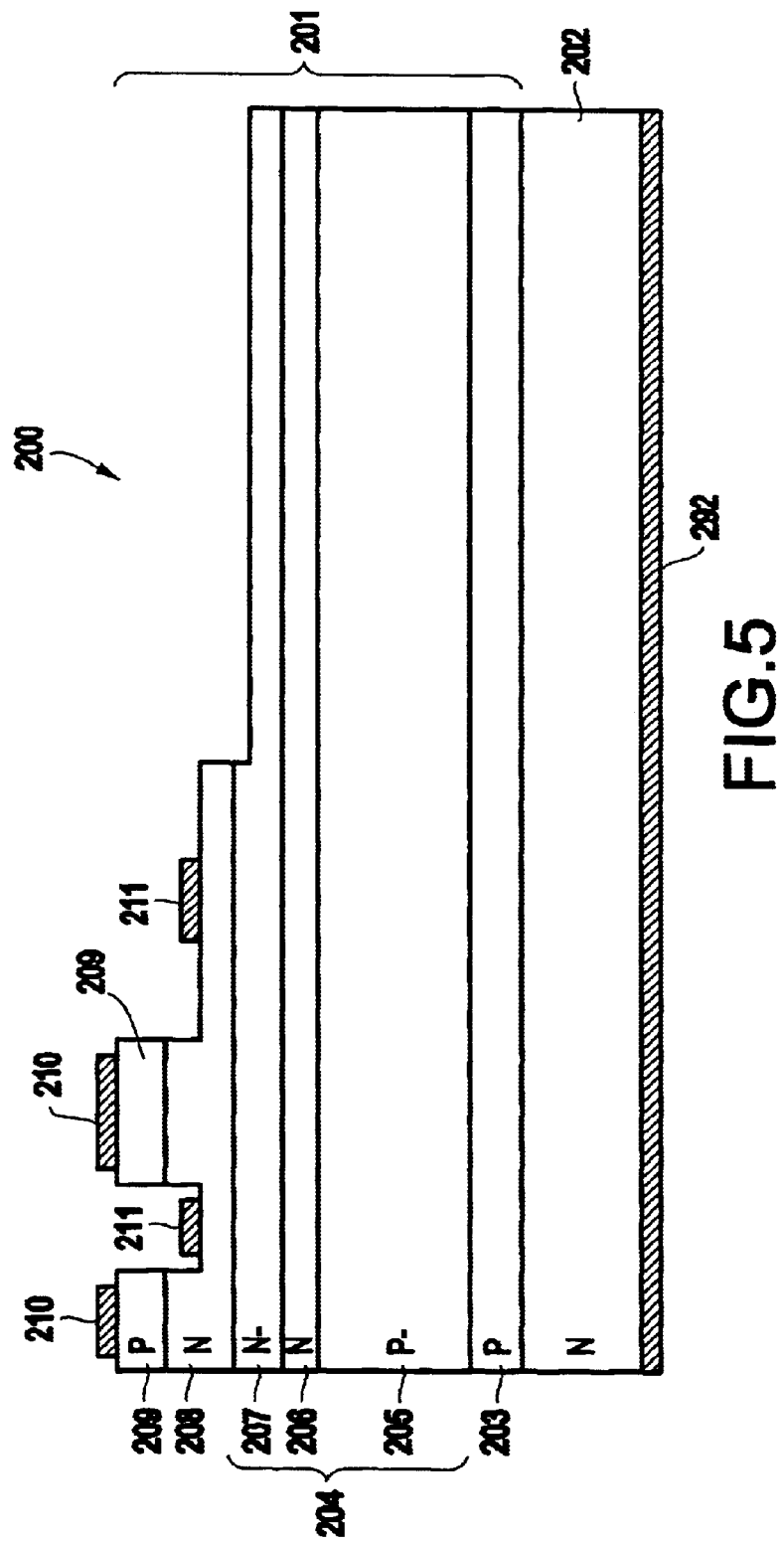
FIG. 5 is a schematic diagram of a silicon carbide GTO thyristor according to a fourth embodiment of the invention.

A fourth embodiment of the invention is shown in FIG. 5, where a thyristor device 200 is illustrated comprising a drift region 204 that includes a p-region 205, a new buffer n region 206, and an n-region 207. The epilayers 201 comprise the buffer region 203, the drift region 204, the gated base region 208, and the anode region 209. Gate contacts 211 and anode contacts 210 top the gated base region 208 and anode region 209, respectively. A substrate 202, which forms the cathode region 202, is also shown with a cathode contact 292 adjacent the cathode region 202. The regions labeled p- or n- in FIG. 5 are the lowest doped semiconductor regions (the intrinsic or "i" regions).

Figure 6:
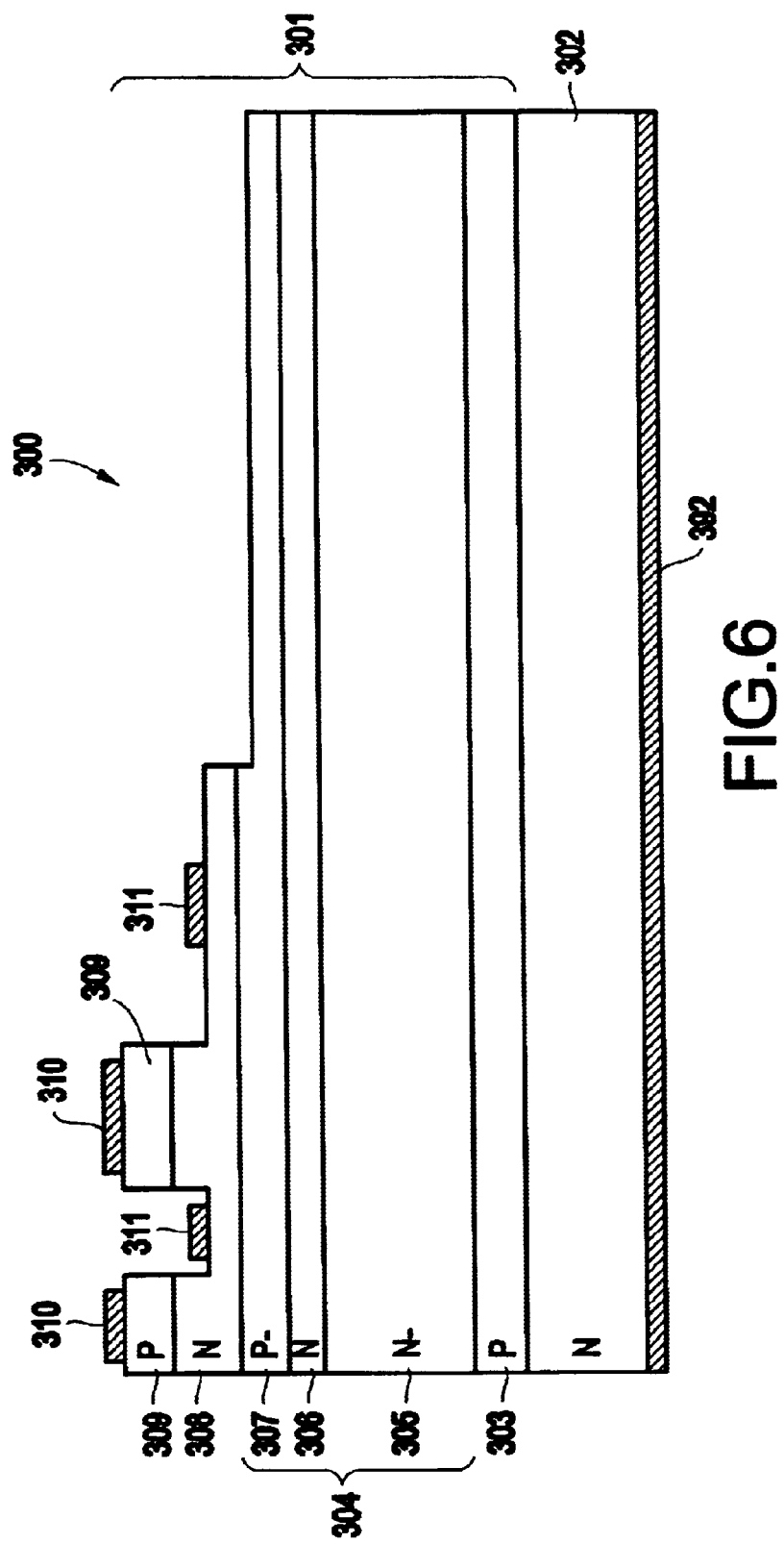
FIG. 6 is a schematic diagram of a silicon carbide GTO thyristor according to a fifth embodiment of the invention.

FIG. 6 illustrates a fifth embodiment of a thyristor device 300 according to the invention. The drift region 304 includes a n-region 305, a new buffer n region 306, a p-layer 307. The epilayers 301 comprise the buffer region 303, the drift region 304, the gated base region 308, and the anode region 309. Gate contacts 311 and anode contacts 310 top the gated base region 308 and anode region 309, respectively. A substrate 302, which forms the cathode region 302, is also shown with a cathode contact 392 adjacent the cathode region 302. The regions labeled p or n- in FIG. 6 are the lowest doped semiconductor regions (the intrinsic or "i" regions).

Figure 7B:
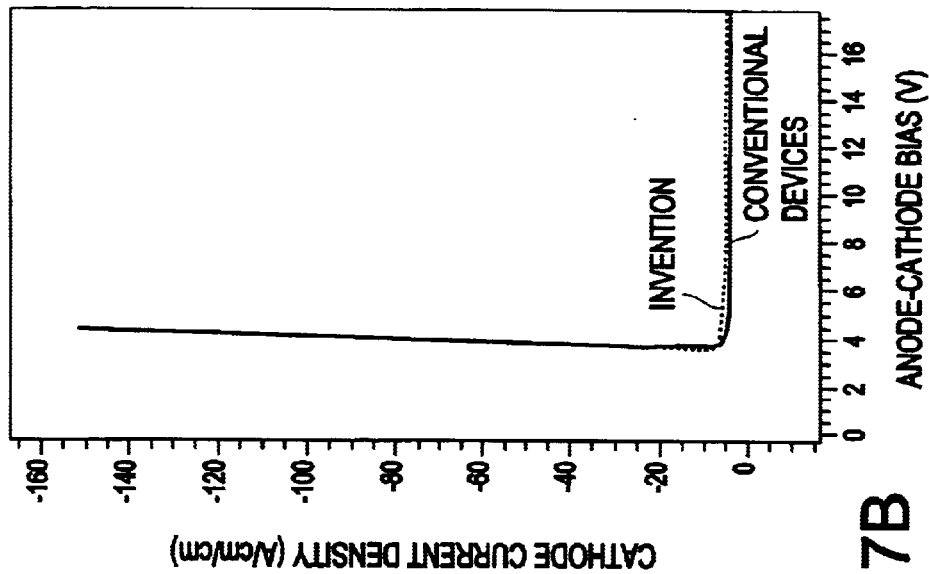
FIG. 7B is a graphical representation comparing the steady state characteristics of an embodiment of the invention with that of a conventional device.
Figure 7A:
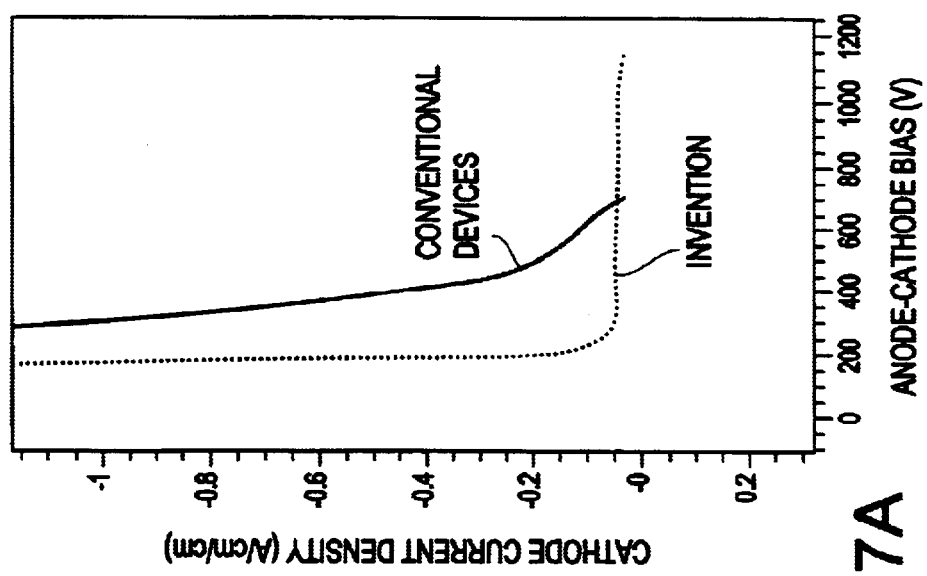
FIG. 7A is a graphical representation comparing the steady state characteristics of an embodiment of the invention with that of a conventional device.
Figure 8B:
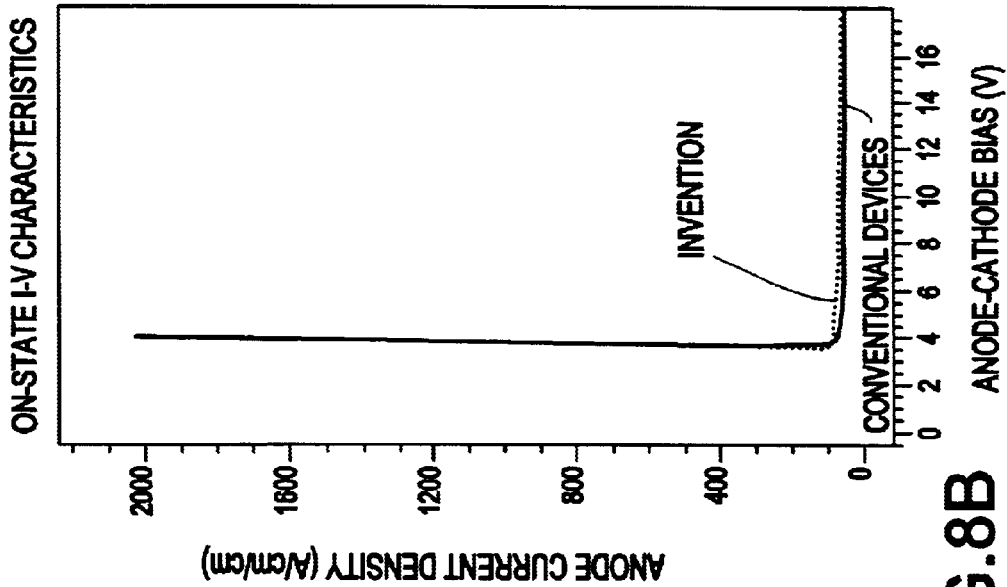
FIG. 8B is a graphical representation of the steady state characteristics of an embodiment of the invention.
Figure 8A:
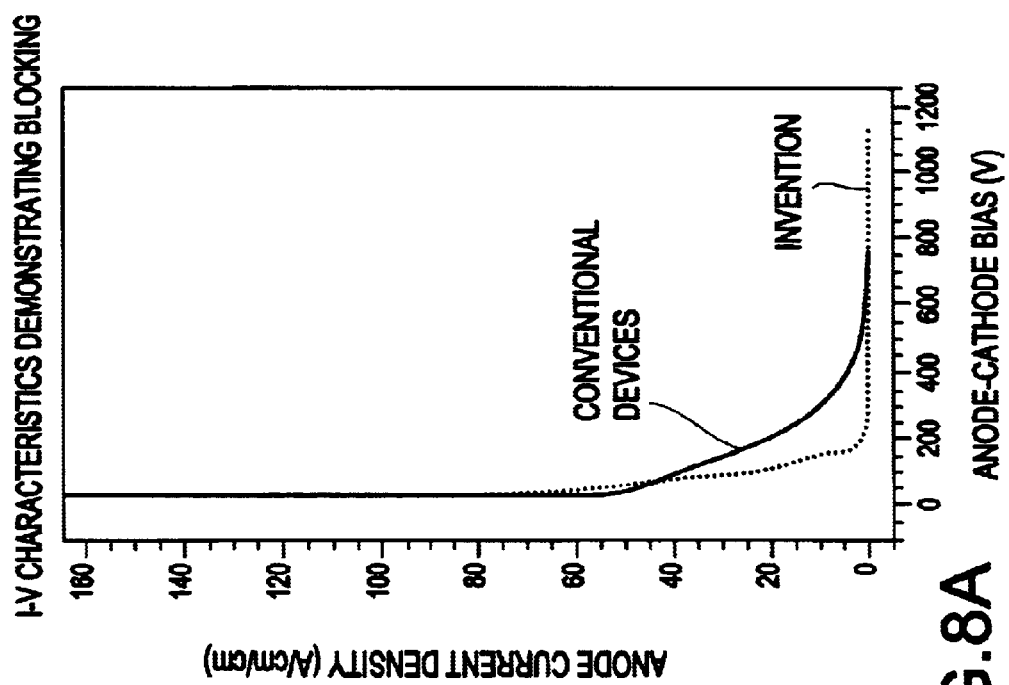
FIG. 8A is a graphical representation of the steady state characteristics of an embodiment of the invention.

The silicon carbide GTO thyristors 1115, 80, 100, 200, 300 of the several embodiments of the invention are operated in a similar manner as conventional silicon carbide GTO thyristors, but with far better performance. The steady state voltage blocking characteristics obtained from numeral simulations are shown vs. cathode current in FIGS. 7A and 7B, and vs. anode current in FIGS. 8A and 8B. Specifically, FIGS. 7A and 7B show steady state characteristics showing the cathode current density of the present invention and the prior art. FIG. 7A shows characteristics demonstrating blocking and FIG. 7B shows the cathode current when the thyristor device of any of the embodiments of the invention is in use. FIGS. 8A and 8B show steady state characteristics showing the anode current density of the various embodiments of the invention and the conventional devices. FIG. 8A shows characteristics demonstrating blocking, and FIG. 8B shows on-state characteristics.

These curves demonstrate the increased blocking voltage of the several embodiments of the invention compared to that of the conventional devices, and as seen, the embodiments of the invention provide a demonstrative increased voltage blocking over their prior art counterparts. The gate current density is 0.5 A/cm$^2$ according to the simulations. The anode current density is higher than the cathode current density due to the anode contact's smaller width. According to the curves, it is seen that the thyristor of the several embodiments of the invention blocks 1127 volts, while the conventional structure blocks only 691 volts, which is best seen in FIG. 8A.

Figure 9:
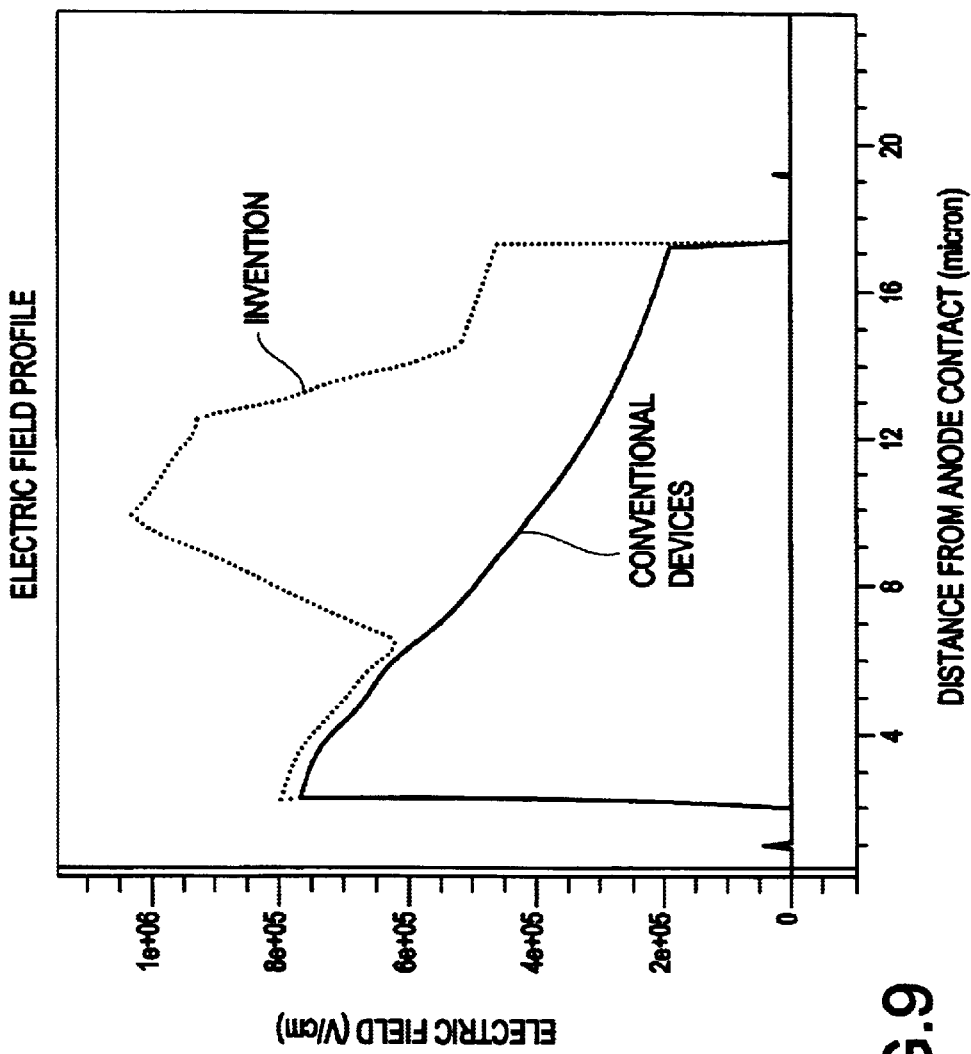
FIG. 9 is a graphical representation of the electric field profile of an embodiment of the invention.

To demonstrate how the embodiments of the invention improve the voltage blocking characteristics of a silicon carbide GTO thyristor, FIG. 9 presents the electrostatic field profile taken along the vertical dashed line in FIGS. 1 and 2. The plot in FIG. 9 indicates that the embodiments of the invention have the high field region displaced away from the top of the drift region. Voltage is the integral of the electrostatic field, and FIG. 9 demonstrates that the embodiments of the invention result in a larger area under the curve before breakdown due to impact ionization occurs. Therefore, a larger voltage can be supported between the anode and the cathode contacts of the invention.

Figure 10:
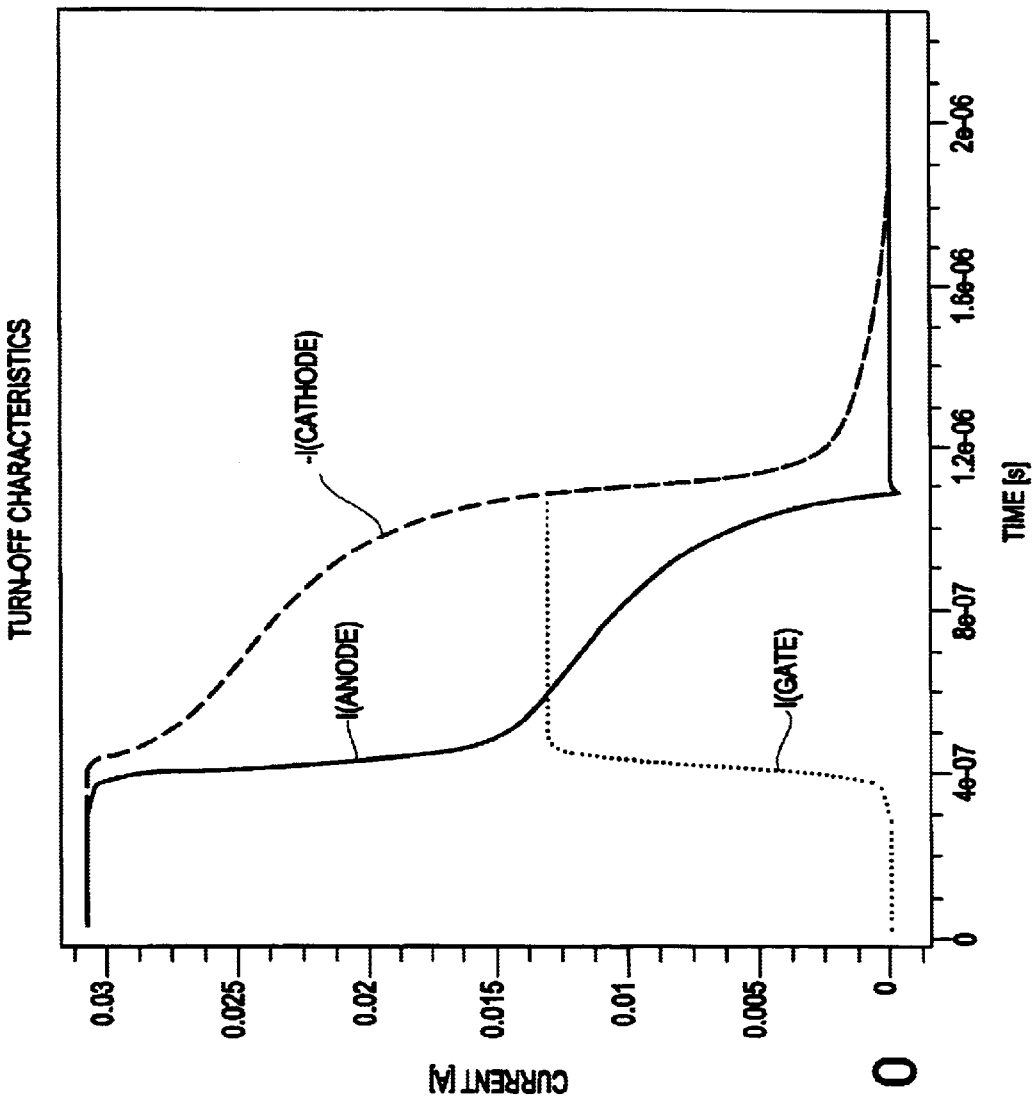
FIG. 10 is a graphical representation of the transient characteristics of an embodiment of the invention.
Figure 11:
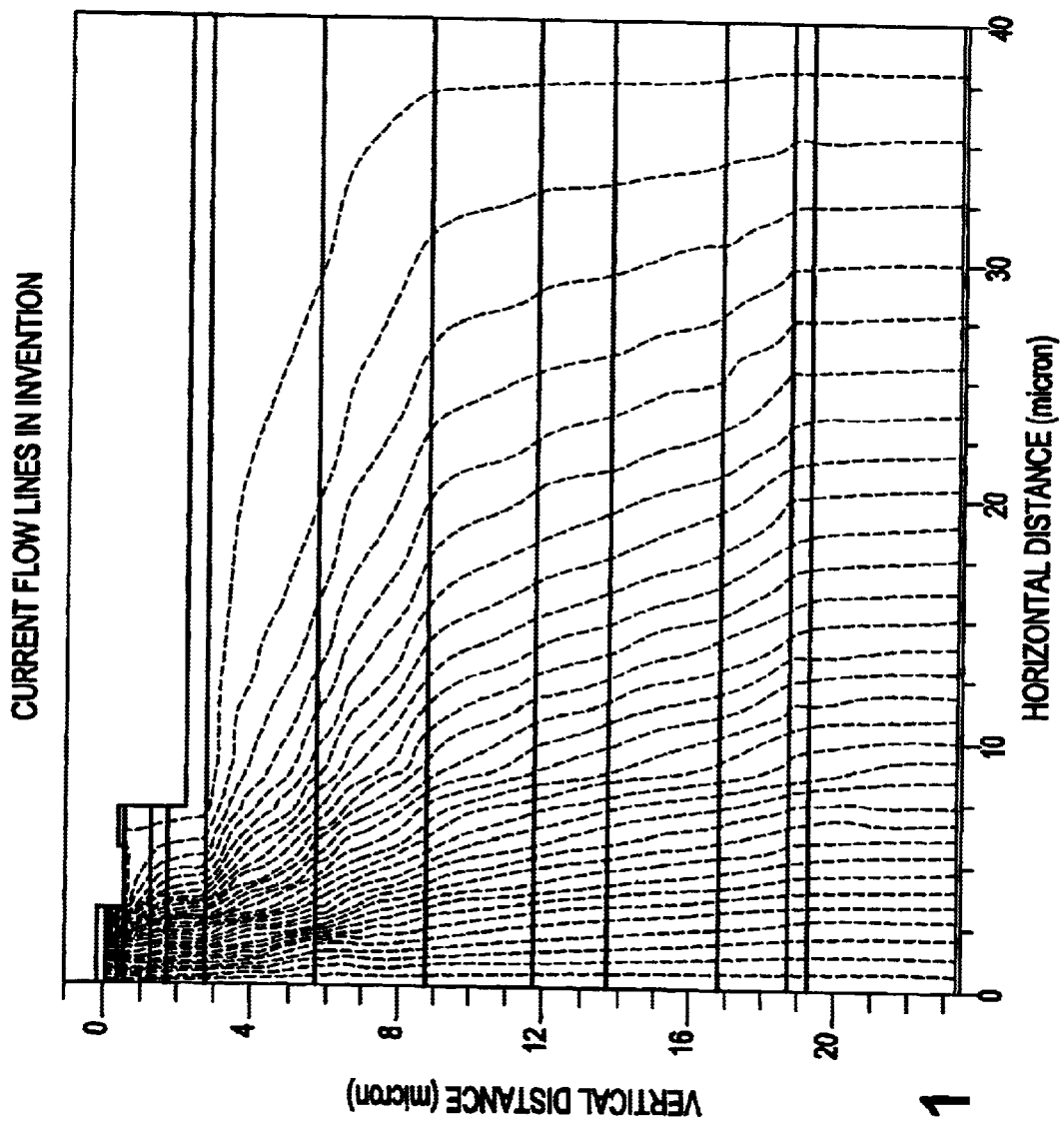
FIG. 11 is a graphical representation of the current flow lines of an embodiment of the invention.

FIG. 10 demonstrates the turn-off performance of the silicon carbide GTO thyristor of the present invention. Specifically, FIG. 10 illustrates transient characteristics of the device of the several embodiments of the invention indicating that the anode and cathode currents are high when the gate current is zero (is latched on) and quasi-static turn-off occurs in 0.7 microseconds. The on-state voltage drop is 3.7 V. This behavior is similar to the turn-off performance of the structure shown in FIG. 1. Moreover, the current flow lines in FIG. 11 demonstrate that the device is well isolated by the shallow etch that is made through the gate and the low doped p-type region. In fact, the current flow lines shown in FIG. 11 are taken over the cross section shown in FIG. 2 to the left of the dashed line when the device 1115 is latched on and conducting a cathode current density of 160 A/cm$^2$. This indicates that the GTO thyristor 1115 is isolated quite well with the shallow etch, even though the additional buffer layers increase the conductivity of the regions beneath the mesa isolation level.

To optimize device performance, the thickness and concentrations of the various buffer layers can be increased or decreased, and the number of regions between region 1102 and region 1108 of FIG. 2 can be increased. In other words, instead of having the drift region 1116 comprising a p–, n, p–, p, p–sequence, one could use a p–, n, p–, n, p–, p, p–, p, p–sequence between regions 1102 and 1108 of FIG. 2. This sequence should be somewhat symmetric in that p–, n, p–type regions are on one side of the center region of the drift region 1116 and p–, p, p–regions are on the other side of the center region of the drift region 1116.

The drift region dopant concentration can range from about $1 \times 10^{13}$ to about $1 \times 10^{16}$ cm$^{-3}$. Moreover, the dopant can comprise either donors or acceptors. The dopant concentration may be above $1 \times 10^{16}$ cm$^{-3}$ if the ionization energy of the dopant is much higher than the ionization energy of the dopant used in the high doped buffer layers 1104, 1106. The low doped regions surrounding the high doped buffer regions preferably range in thickness from approximately 0.5 micron to approximately 100 microns or more, depending upon how much voltage the device is designed to block. Preferably, the high doped regions should be no more than about 30 percent of the drift region 1116.

The high doped buffer layers 1104, 1106 are most effective if they are located below the surface. Therefore, as previously mentioned, when the thyristor devices of the several embodiments of the invention are mesa isolated by an etch step, this etch should preferably stop in the "i" layer 87, 114, 207, 307, 1103. Therefore, the "i" layer on top of the high doped buffer layer 87, 114, 207, 307, 1103 is preferably sufficiently thick for this isolation etch to stop within this layer and not pass through.

As seen, in order to increase the voltage blocked in the devices of the embodiments of the invention, additional i-n-i and i-p-i layers are added to the conventional drift region to reshape the electrostatic field so that the maximum of this field is moved away from the upper portion of the drift region.

Moreover, in some cases only one set of i-n-i and i-p-i layers are necessary, although up to three sets may be necessary for very thick drift region structures. Even more sets are allowed if necessary. The high doped buffer layer 1106, 86, 113, 206, 306 is preferably configured such that the "i" region below it is thicker than the "i" region above it.

Experimental Procedure

Figure 12:
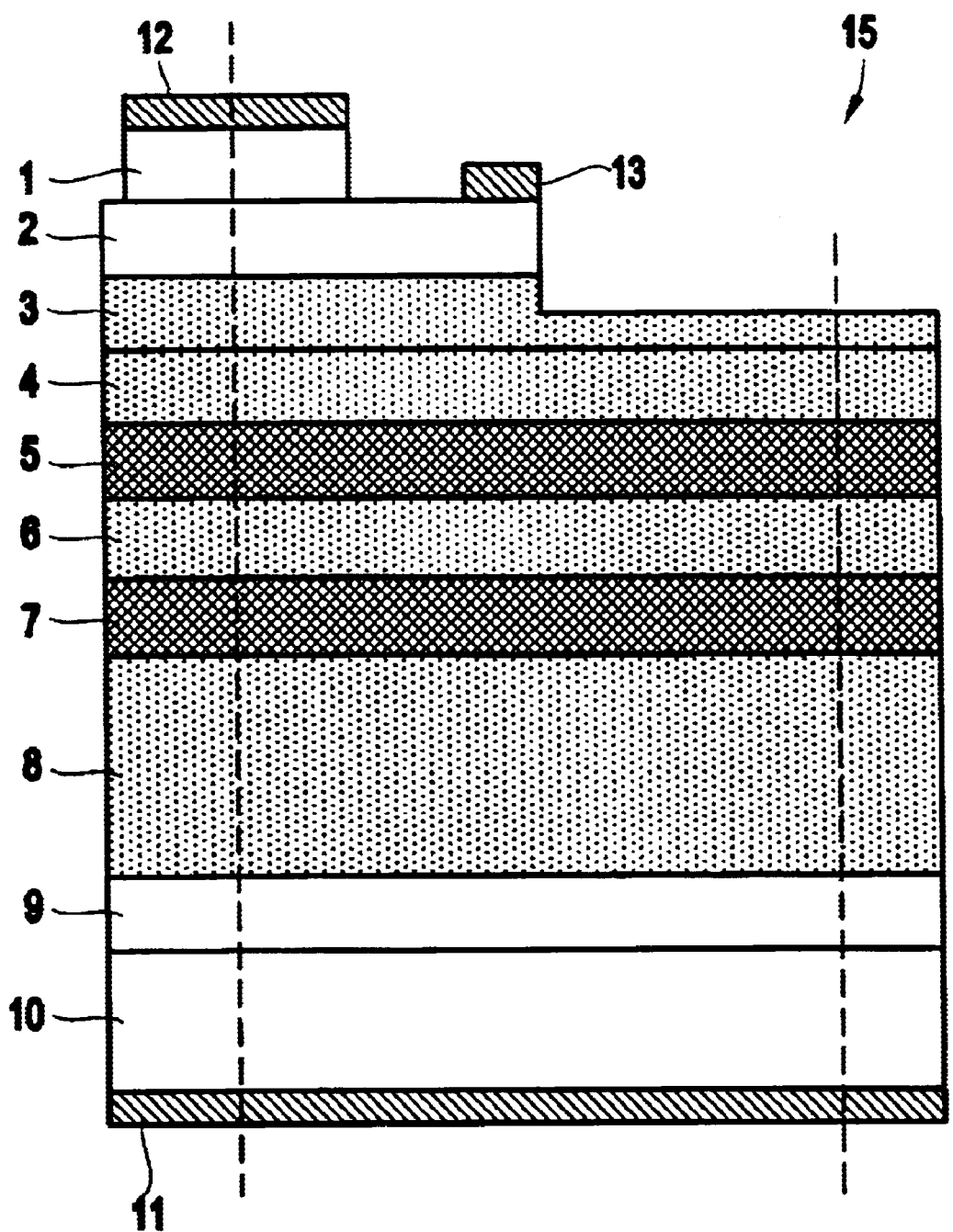
FIG. 12 is a schematic diagram of a silicon carbide GTO thyristor according to a sixth embodiment of the invention.

Simulations were performed over a two-dimensional cross section of the GTO thyristor structure 15 shown in FIG. 12 using a Silvaco Incorporated Atlas/Blaze Drift-diffusion model simulator, available from Silvaco International, Calif., USA. To model the properties of 4H-SiC, measured values of mobility, impact ionization, dopant ionization energies, and energy gap were included in the experiment.

FIG. 12 illustrates a silicon carbide GTO thyristor 15 according to a sixth embodiment of the invention that was simulated. Regions 3, 4, 5, 6, 7, and 8 comprise the multi-layered drift region, with region 9 being a buffer region. The thyristor device 15 further comprises a substrate 10, which serves as a cathode region 10 as well. Furthermore, the device 15 includes a gate region 2 with an anode region 1 disposed thereon. An anode contact 12, gate contact 13, and cathode contact 11 are further included which connect to the anode region 1, gate region 2, and cathode region 10, respectively. The regions 1, 3, 4, 6, 8, and 9 are p type, and regions 2, 5, 7, and 10 are n type. Regions 5 and 7 shown in FIG. 12 are regions that are more highly doped than the other regions. Table 3 gives the structures simulated for the results given in FIG. 13, wherein FIG. 13 shows the electrostatic field profiles along the left most vertical dotted line in FIG. 12, demonstrating the improvement brought about by adding the buffer layers 5 and 7.

TABLE 3

Figure 13:
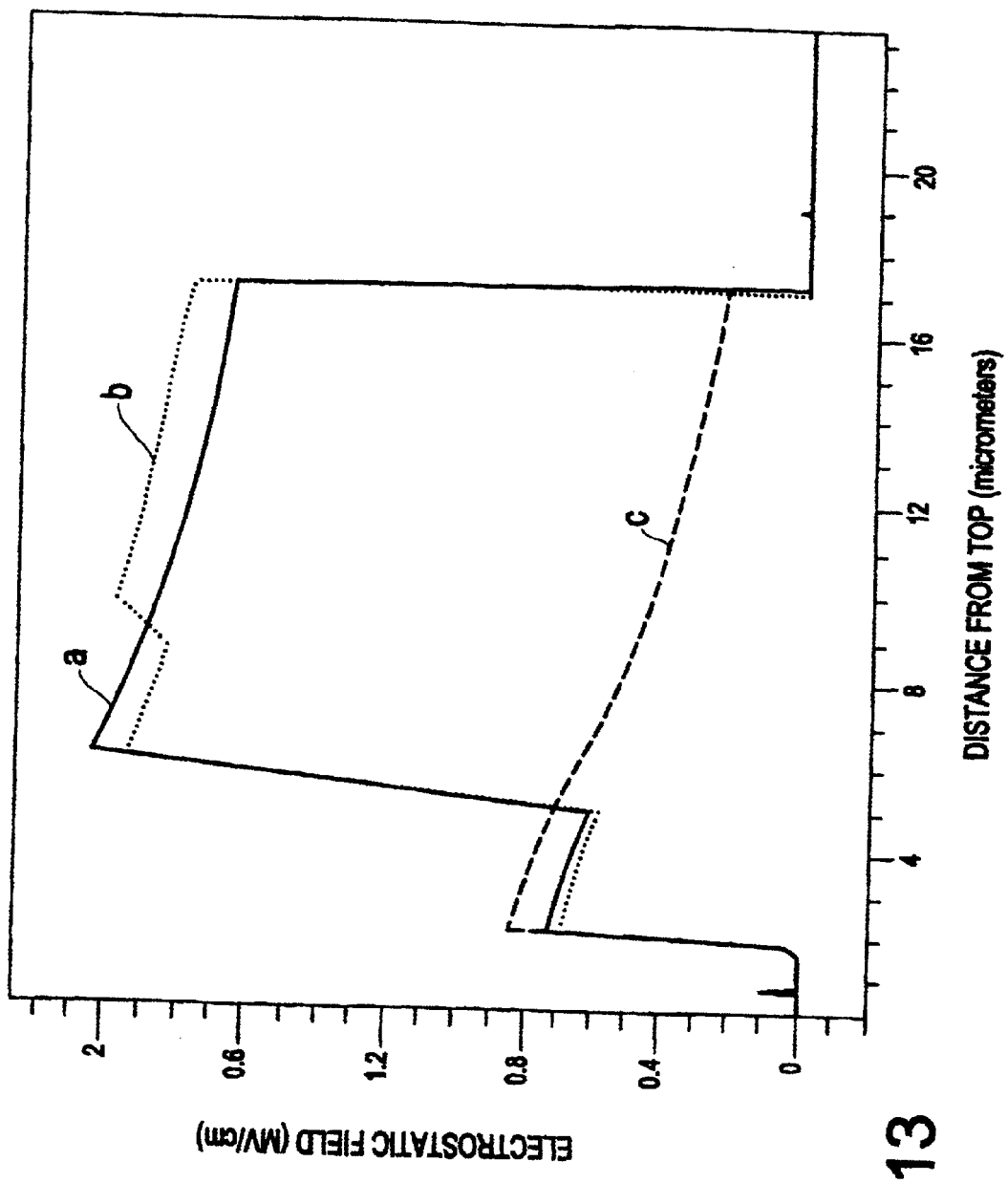
FIG. 13 is a graphical representation of the electrostatic field profiles of both an embodiment of the invention and a conventional device.

Structural parameters for the SiC GTO thyristor simulated for FIG. 13

| Layer | Concentration | Thickness |
|---|---|---|
| Anode | $N_A = 2 \times 10^{19}$ cm$^{-3}$ | 1.0 μm |
| Gated base | $N_D = 6 \times 10^{17}$ cm$^{-3}$ | 2.0 μm |
| Drift region | $N_A = 1 \times 10^{15}$ cm$^{-3}$ | 15.0 μm |
| P+ buffer | $N_A = 9 \times 10^{17}$ cm$^{-3}$ | 2.0 μm |
| Substrate | $N_D = 5 \times 10^{18}$ cm$^{-3}$ | 295.0 μm |

The drift region for three particular cases (a, b, c) is shown in Table 4. The plots shown in FIG. 13 are simulation results for structures described by Table 3 except that the drift region for three cases (a, b, c) are given by Table 4. For case a, layers 6, 7, and 8 are all identical and described by the third row of column a in Table 4. For case b, layers 4, 5, 6, 7, and 8 are described by the top five rows of column b of Table 4. For case c, layers 4, 5, 6, 7, and 8 are identical and are all described by the first row of column c of Table 4.

TABLE 4

| | Simulated Cases | |
|---|---|---|
| a | b | c |
| $N_A = 1 \times 10^{15}$ (3 μm) | $N_A = 1 \times 10^{15}$ (3 μm) | $N_A = 1 \times 10^{15}$ (15 μm) |
| $N_D = 8 \times 10^{16}$ (1 μm) | $N_D = 8 \times 10^{16}$ (1 μm) | |
| $N_A = 1 \times 10^{15}$ (11 μm) | $N_A = 1 \times 10^{15}$ (6.5 μm) | |
| | $N_D = 1 \times 10^{16}$ (1.5 μm) | |
| | $N_A = 1 \times 10^{15}$ (3 μm) | |
| $N_A = 5 \times 10^{18}$ (2 μm) | $N_A = 5 \times 10^{18}$ (2 μm) | $N_A = 5 \times 10^{18}$ (2 μm) |

Table 4 shows drift region and buffer region designs for the three cases shown in FIG. 13. The stacking of the layers in these regions are presented in the columns for structures a, b, and c. All concentrations are in cm$^{-3}$. Moreover, the thickness of each region is listed below the concentration. The results as provided by Table 4 and FIG. 13 indicate that adding extra layers to the drift region as was done in case a and furthermore in case b increases the voltage blocked by the device 15. The $V_{BR}$ can be increased with additional high doped layers in the drift region that reshape the electrostatic field. FIG. 13 shows the electrostatic field profile when the device has reached its break over voltage, along the left most vertical dashed line in FIG. 12 for a structure that blocks 2340 V (curve a), 2382 V (curve b), and 757 V (curve c). Again, the structural parameters for these three cases are provided in Table 4. Moreover, additional pin layers can be added to additionally flatten the top of the field profile.

The additional pin layers favorably reshape the electrostatic field in the drift region by increasing the area under the curve which is directly proportional to the voltage blocked by the device, $$V = \int E \cdot dy$$

wherein E is the electrostatic field and y corresponds to a position along the horizontal axis of FIG. 13. This figure clearly shows that the buffer layers displace the peak of the field away from the corner formed by the mesa isolation etch and reduces the requirement for very good field terminations at the top of the material exposed after the mesa isolation step.

Figure 14:
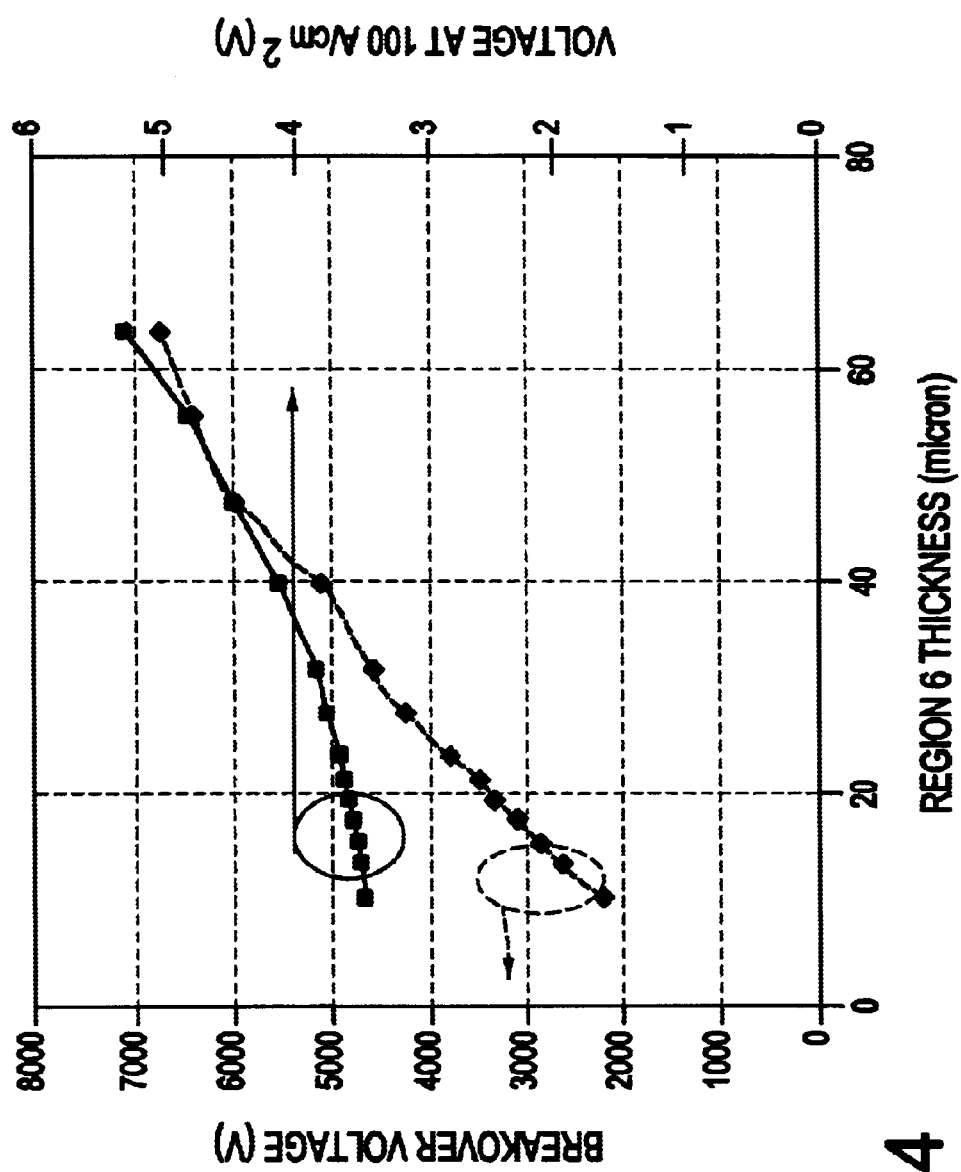
FIG. 14 is a graphical representation of the blocking voltage profiles and on-state voltage profiles of an embodiment of the invention.

For the same structure that blocked 2211 V in the simulations above, FIG. 14 presents the change seen in the on-state voltage drop across the device as the drift region thickness increases. FIG. 14 demonstrates that as the $V_{BR}$ increases from 2.2 to 6.7 kV, the on-state voltage drop also increases at an increasing rate. The holding current also increases from 18 A/cm$^2$ (region 6 thickness=31.5 microns) to 25 A/cm$^2$ (47.5 microns) to 30 A/cm$^2$ (63.5 microns). These device characteristics also depends upon the thickness and concentration of the n-type buffer region.

The device 15 may only have to be isolated from micropipes and other defects by etching down through the n-type gated layer 2. It is very likely that even if one of the n-type buffer layers within the drift region is shorted through because of defects such as micropipes, the device 15 would be well isolated from it because of the high lateral resistance of the p-typed doped layers. Furthermore, simulations indicate that near the bottom of the n-type buffer layer the vertical current drops to 20 percent of its maximum 10 μm out from the center of the anode finger and drops to 10 percent of its maximum 20 μm out. This is important for device isolation. If the current does not reduce away from the device 15, then defects within the material, which may be far from the device 15, will short out regions within the device 15.

The embodiments of the invention achieve several advantages. For example, the invention reduces the number of processing steps involved in forming a high voltage blocking device because the lithography and deposition steps needed for field rings and field plates, or the lithography, implant and annealing processing steps required of guard rings or junction termination extensions can be avoided. An embodiment of the invention also makes it possible to develop high voltage blocking devices by using a thinner overall drift region which has the added benefit of lower cost and better material quality. In fact, because the material quality worsens as an epilayer becomes thicker, which is a problem inherent in the conventional devices, an embodiment of the invention overcomes this deficiency by providing thinner multiple layers.

Because of their higher doping levels allowed for a given voltage in silicon carbide, the silicon carbide thyristors of the invention can have a thinner drift region and a much lower on-resistance than comparable silicon thyristors of equivalent size, or much smaller thyristors for the same on-resistance. The high electric breakdown field, the high saturated electron drift velocity, and the high thermal conductivity achieved by the invention offer further physical and electronic advantages. Furthermore, the ability to operate at high power levels and high temperatures, for example, greatly reduces the weight of space-based electronic cooling systems required for semiconductor devices, and the radiation hardness of silicon carbide enhances its attractiveness for several types of industrial applications.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A voltage blocking device comprising:
   a cathode region;
   a drift region positioned on said cathode region;
   a gate region positioned on said drift region;
   an anode region positioned on said gate region; and
   a plurality of contacts positioned on each of said cathode region, said gate region, and said anode region,
   wherein said drift region comprises multiple epilayers having first doped type layers surrounding second doped type layers,
   wherein dopant concentrations of said first doped type layers are lower than dopant concentrations of said second doped type layers.

2. The device of claim 1, wherein said epilayers comprise at least one i-n-i layer.

3. The device of claim 1, wherein said epilayers comprise at least one i-p-i layer.

4. The device of claim 1, wherein said device comprises silicon carbide.

5. The device of claim 4, wherein said device is a gate turn-off (GTO) thyristor.

6. The device of claim 1, wherein said device comprises any one of an insular gate bipolar transistor, a silicon controlled rectifier, a pin diode, a gate turn-off device, and a metal oxide semiconductor turn-off device.

7. The device of claim 1, wherein said multiple epilayers are operable to block voltages in said device.

8. A silicon carbide thyristor device comprising:
   a cathode region;
   a drift region positioned on said cathode region;
   a gate region positioned on said drift region;
   an anode region positioned on said gate region; and
   a plurality of ohmic contacts positioned on each of said cathode region, said gate region, and said anode region,
   wherein said drift region comprises multiple doped layers comprising n-type and p-type dopants and having first doped type layers surrounding second doped type layers,
   wherein dopant concentrations of said first doped type layers are lower than dopant concentrations of said second doped type layers, and
   wherein said multiple doped layers are operable to block voltages in said device.

9. The device of claim 8, wherein said multiple doped layers comprise at least one i-n-i layer.

10. The device of claim 8, wherein said multiple doped layers comprise at least one i-p-i layer.

11. The device of claim 8, wherein said device is a gate turn-off (GTO) thyristor.

12. The device of claim 8, wherein said device comprises any one of an insular gate bipolar transistor, a silicon controlled rectifier, a pin diode, a gate turn-off device, and a metal oxide semiconductor turn-off device.

13. A method of increasing a voltage threshold in a voltage blocking device comprising a cathode region adjacent a drift region, said drift region adjacent a gate region, and said gate region adjacent an anode region, said method comprising adding additional epilayers to said drift region, wherein each one of said epilayers comprises a predetermined dopant concentration.

14. The method of claim 13, wherein said epilayers comprise at least one i-n-i layer.

15. The method of claim 13, wherein said epilayers comprise at least one i-p-i layer.

16. The method of claim 13, wherein said device comprises silicon carbide.

17. The method of claim 16, wherein said device is a gate turn-off (GTO) thyristor.

18. The method of claim 13, wherein said device comprises any one of an insular gate bipolar transistor, a silicon controlled rectifier, a pin diode, a gate turn-off device, and a metal oxide semiconductor turn-off device.

19. The method of claim 13, wherein said step of adding additional epilayers to said drift region causes an electrostatic field located in said device to move away from an upper portion of said drift region.

20. The method of claim 13, wherein said multiple epilayers block voltages in said device.

* * * * *